(12) United States Patent  (10) Patent No.: US 9,198,314 B2
Huang  (45) Date of Patent: Nov. 24, 2015

(54) USB MEMORY STICK

(71) Applicant: HO E SCREW & HARDWARE CO., LTD., Taoyuan (TW)

(72) Inventor: Joseph Huang, Taoyuan (TW)

(73) Assignee: HO E SCREW & HARDWARE CO., LTD., Taoyuan (TW)

(*) Notice: Subject to any disclaimer, the term of this patent is extended or adjusted under 35 U.S.C. 154(b) by 240 days.

(21) Appl. No.: 14/071,298

(22) Filed: Nov. 4, 2013

(65) Prior Publication Data
US 2014/0211407 A1  Jul. 31, 2014

(30) Foreign Application Priority Data

Jan. 25, 2013 (TW) ............................. 102201621 U

(51) Int. Cl.
G06F 1/16 (2006.01)
H05K 5/02 (2006.01)
G06K 19/077 (2006.01)

(52) U.S. Cl.
CPC ........ H05K 5/0278 (2013.01); G06K 19/07732 (2013.01)

(58) Field of Classification Search
CPC ....... G06F 1/181; G06F 1/187; H05K 5/0217; H05K 5/0278
USPC ...................................................... 361/679.32
See application file for complete search history.

(56) References Cited

U.S. PATENT DOCUMENTS

| 2009/0316368 | A1* | 12/2009 | Hiew | ................... | H05K 5/0278 361/737 |
| 2013/0114201 | A1* | 5/2013 | Huang | ................. | G06F 1/1613 361/679.32 |
| 2014/0340835 | A1* | 11/2014 | Wang | ..................... | G06F 1/183 361/679.32 |
| 2014/0340836 | A1* | 11/2014 | Hsieh | ............... | G06K 19/07732 361/679.32 |

* cited by examiner

Primary Examiner — Anthony Q Edwards
(74) Attorney, Agent, or Firm — Guice Patents PLLC

(57) ABSTRACT

A USB memory stick includes housing having a frame hole, a tray providing a fastening structure, and a memory attached to the tray and mounted with the tray in the housing. The memory includes a mating fastening structure fastened to the fastening structure of the tray, a stepped bottom wall formed of a plurality of steps rising one behind another, a plurality of vertical clearance compensation spring leaves respectively disposed corresponding to the steps, and a mating locating block forced into engagement with the frame hole of the housing.

12 Claims, 6 Drawing Sheets

B-B

A-A

USB MEMORY STICK

BACKGROUND OF THE INVENTION

1. Field of the Invention

The present invention relates to USB memory stick technology and more particularly, to a USB memory stick, which facilitates quick assembly, hanging and carrying.

2. Description of the Related Art

USB is an industry standard that defines the cables, connectors and communications protocols used in a bus for connection, communication, and power supply between computers and electronic devices. USB has now become commonplace on other devices, such as set-top-boxes and video game consoles. Many advanced USB data storage devices having relatively smaller size and relatively larger storage capacity have been created and appeared on the market.

A USB memory stick is a mobile data storage device including a memory with an integrated USB interface convenient for carrying and connectable to a computer for data access. Following development of data storage technology, USB memory stick storage capacity has been greatly expanded for wide field applications, and many USB memory stick circuit board specifications have been created. However, the assembly process of conventional USB memory sticks is complicated and inconvenient. Further, USB memory sticks are so small that can easily be lost. An improvement in this regard is desired.

SUMMARY OF THE INVENTION

The present invention has been accomplished under the circumstances in view. It is the main object of the present invention to provide a USB memory stick, which facilitates quick assembly.

It is another object of the present invention to provide a USB memory stick, which facilitates hanging and carrying.

To achieve these and other objects of the present invention, a USB memory stick of the present invention comprises a housing, a tray and a memory. The housing is a hollow frame shell having a predetermined height and width. Further, the housing comprises mounting positioning means. The tray comprises fastening means. The memory is attachable to the tray and mountable with the tray in the housing. The memory comprises mating fastening means fastenable to the fastening means of the tray, a stepped bottom wall formed of a plurality of steps rising one behind another, vertical clearance compensation spring means disposed corresponding to the steps, and mating mounting positioning means for engagement with the mounting positioning means of the housing.

Preferably, the fastening means of the tray comprises a plurality of locating grooves located one of opposing top and bottom surfaces of the tray. Preferably, the mating fastening means of the memory comprises a plurality of locating blocks located on one of opposing top and bottom surfaces of the memory and respectively engageable into the locating grooves of the fastening means of the tray.

Preferably, the locating grooves are located on the top surface of the tray and respectively extending in longitudinal and transverse directions. Further, the tray comprises a plurality of raised ribs located on the top surface thereof and respectively surrounding locating grooves. Further, the locating blocks are located on the bottom surface of the memory and respectively extending in longitudinal and transverse directions, and respectively engaged into the locating grooves of the tray.

Further, the locating grooves of the tray that extend in one of the longitudinal and transverse directions are open-ended grooves, and the other locating grooves that extend in the other of the longitudinal and transverse directions are close-ended grooves.

Preferably, the stepped bottom wall of the memory is formed of a first step, a second step and a third step that rise one behind another. Preferably, the vertical clearance compensation spring means of the memory comprises a first vertical clearance compensation spring leaf positioned in a hole in the first step of the memory, a second vertical clearance compensation spring leaf positioned in a hole in the second step of the memory, and a third vertical clearance compensation spring leaf positioned in the third step of the memory. The first vertical clearance compensation spring leaf and the second vertical clearance compensation spring leaf respectively protrude over opposing top and bottom surfaces of the memory. Further, the third vertical clearance compensation spring leaf protrudes over the opposing top and bottom surfaces of the memory corresponding to the third step at a relatively smaller height than the elevational protrusion of the first vertical clearance compensation spring leaf and the second vertical clearance compensation spring leaf.

Preferably, the first vertical clearance compensation spring leaf protrudes over the top surface of the memory corresponding to the first step, and the second vertical clearance compensation spring leaf protrudes over the bottom surface of the memory corresponding to the second step.

Preferably, the memory further comprises an end portion located at one end thereof, and a hanging hole formed in the end portion.

In an alternate form of the present invention, the USB memory stick further comprises an end piece made in the form of a safety hook and fastened to the memory. The end piece comprises a throat, and a spring-loaded latch adapted to normally close the throat.

Preferably, the memory comprises at least one springy hook block. Preferably, the end piece comprises at least one hook hole respectively engaged with the at least one spring hook block of the memory.

Other advantages and features of the present invention will be fully understood by reference to the following specification in conjunction with the accompanying drawings, in which like reference signs denote like components of structure.

BRIEF DESCRIPTION OF THE DRAWINGS

FIG. 3A is a bottom view of FIG. 3.

DETAILED DESCRIPTION OF THE PREFERRED EMBODIMENT

Figure 1:
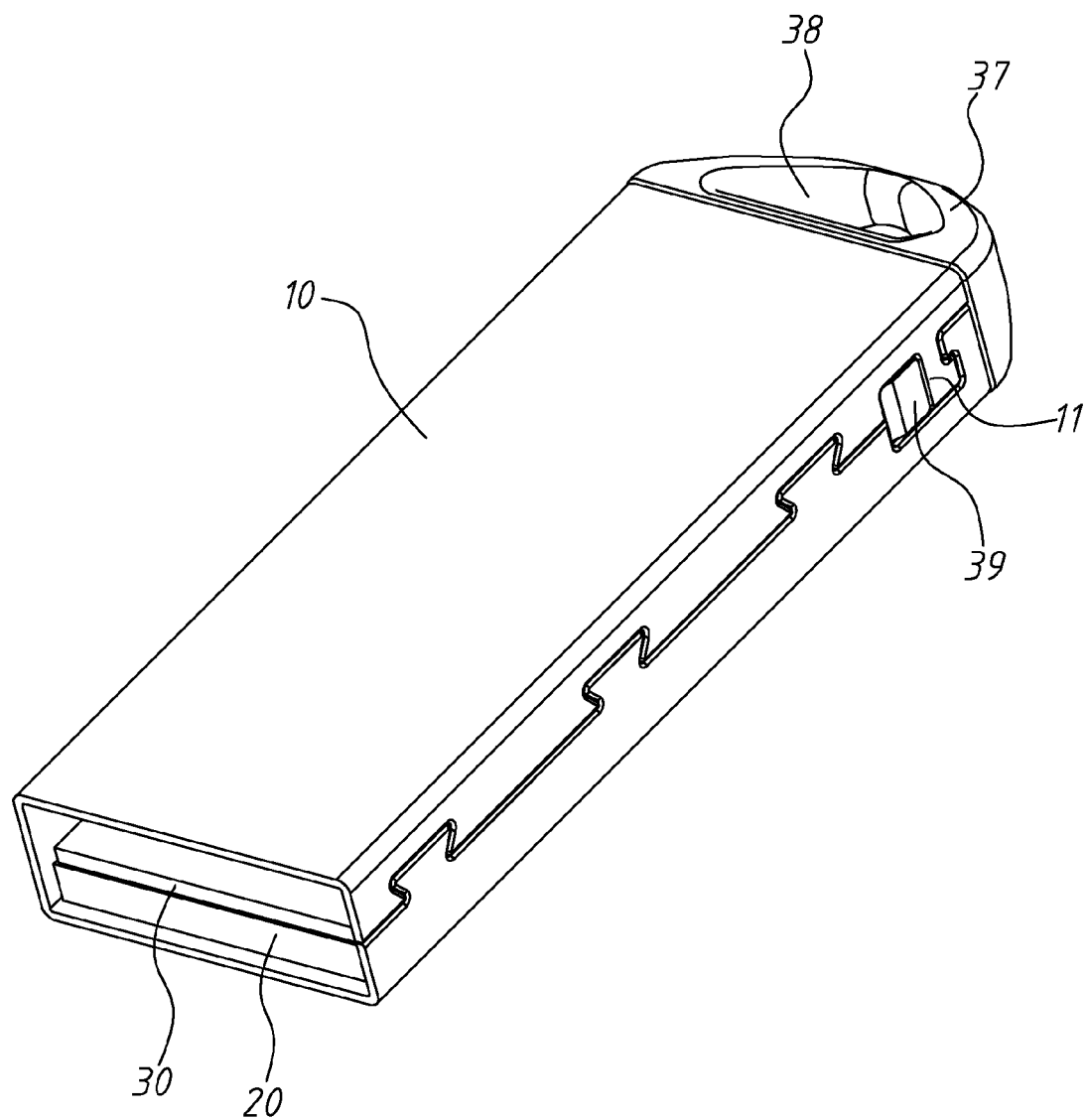
FIG. 1 is an oblique top elevational view of a USB memory stick in accordance with a first embodiment of the present invention.
Figure 2:
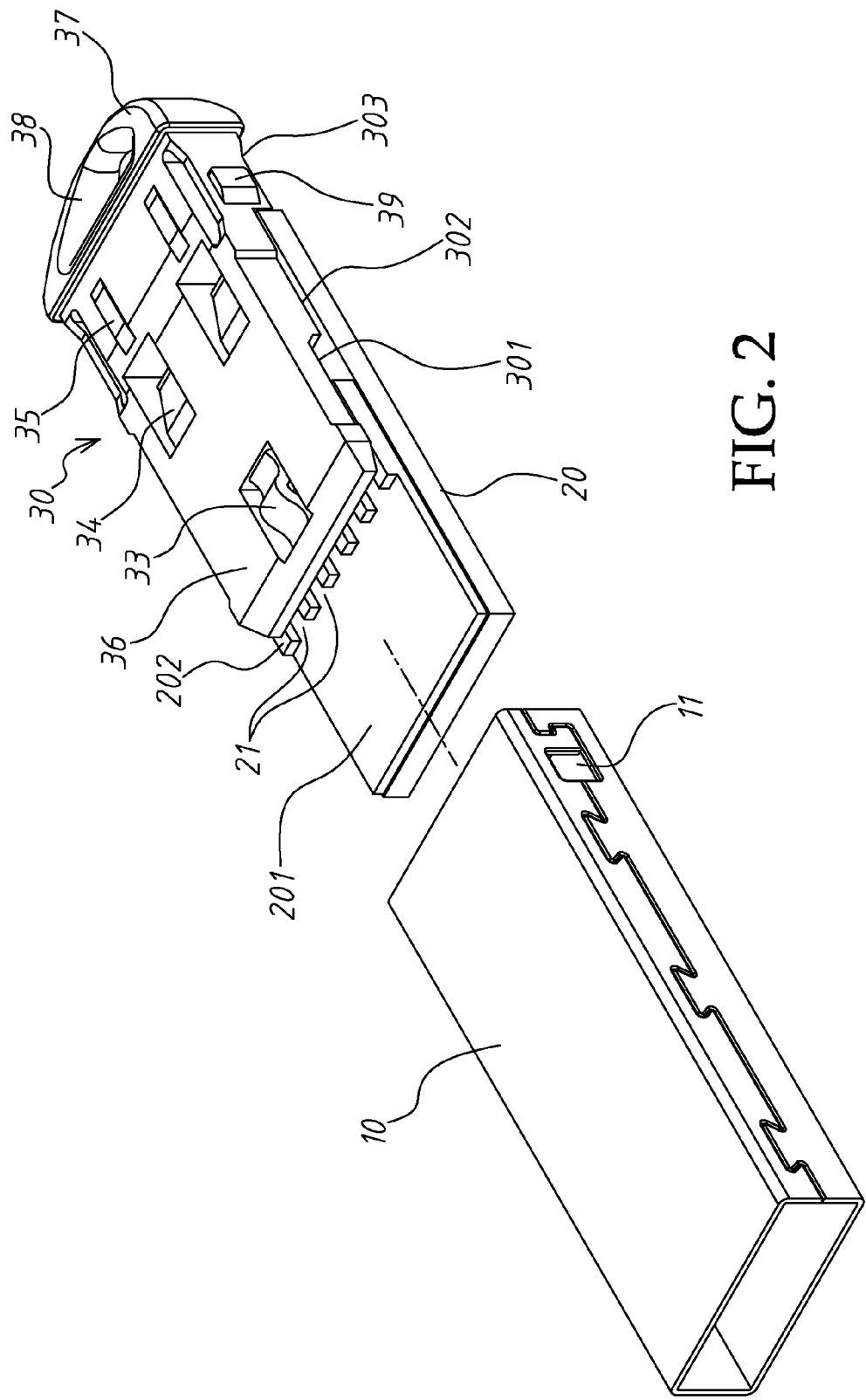
FIG. 2 is an exploded view of the USB memory stick in accordance with the first embodiment of the present invention.

Referring to FIGS. 1 and 2, a USB memory stick in accordance with a first embodiment of the present invention is shown. The USB memory stick of this first embodiment comprises a housing 10, a memory 30, and a tray 20 carrying the memory 30. The housing 10 is a hollow frame shell having a predetermined longitudinal height and transverse width for accommodating the memory 30 and the tray 20.

Figure 3:
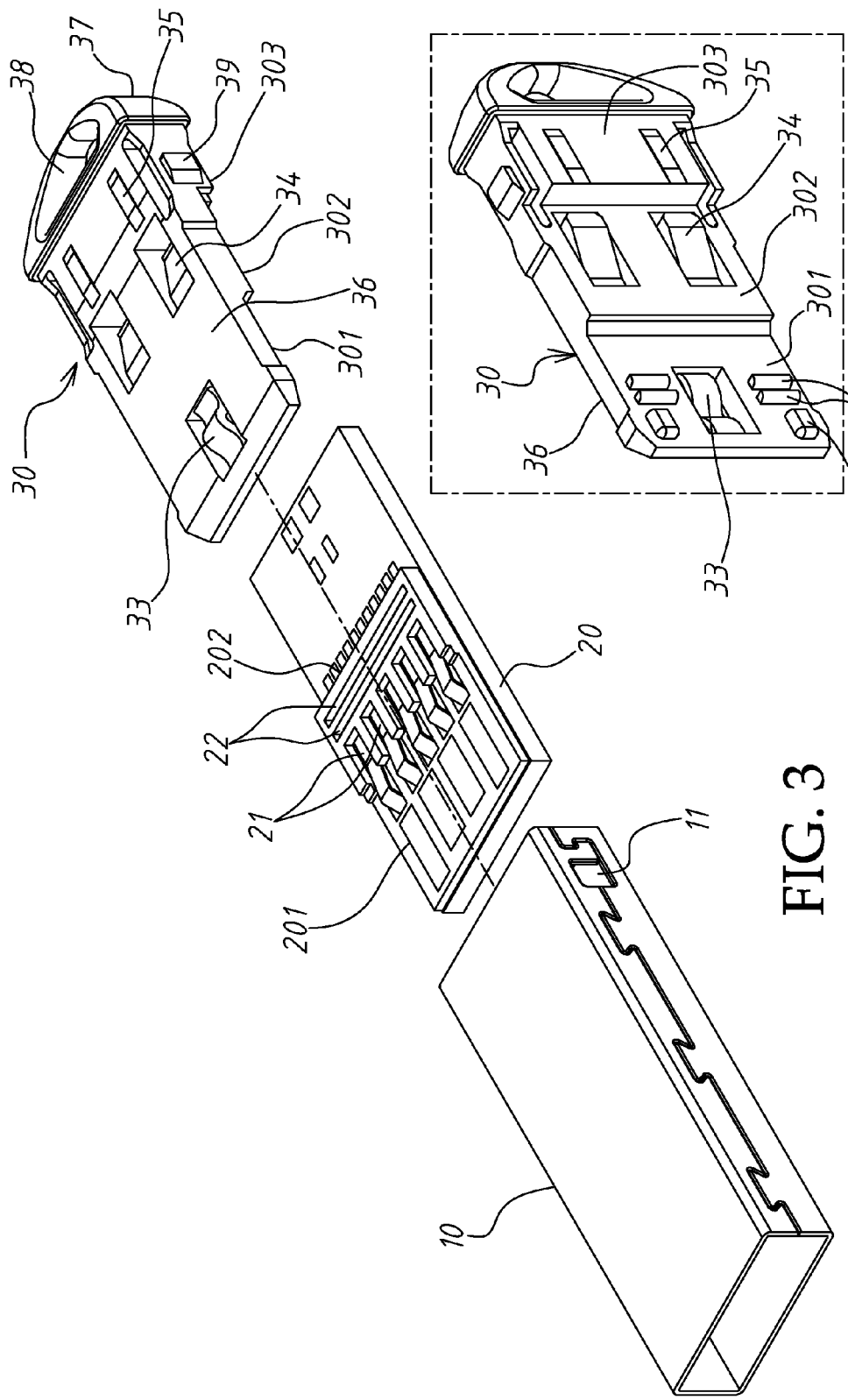
FIG. 3 is another exploded view of the USB memory stick in accordance with the first embodiment of the present invention.
Figure 4:
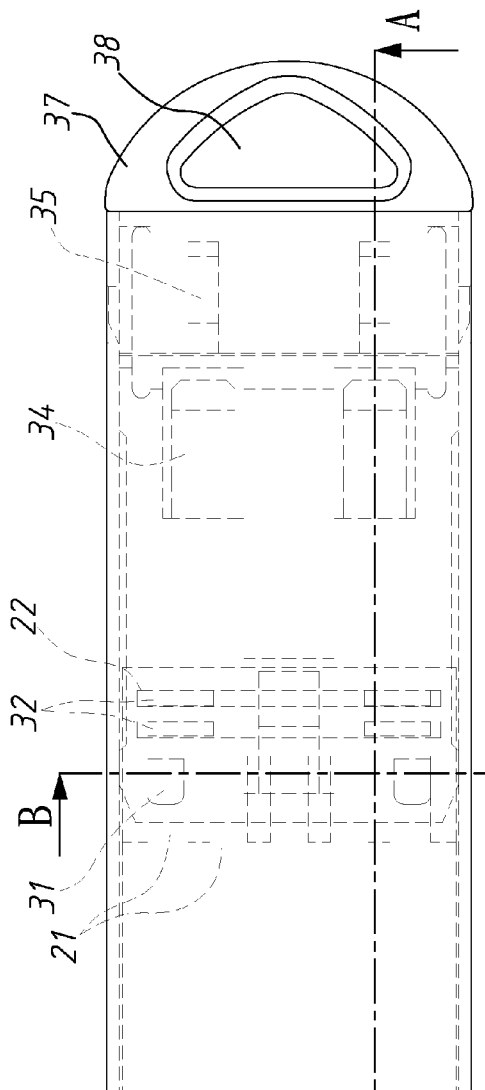
FIG. 4 is a front view of FIG. 1.
Figure 6:
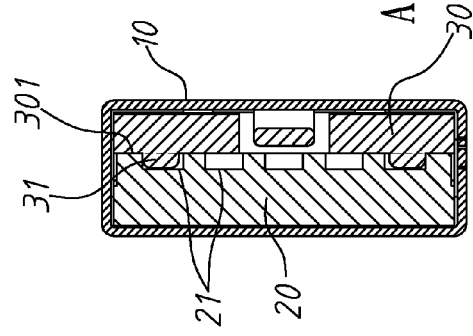
FIG. 6 is a sectional view taken along line B-B of FIG. 4.
Figure 5:
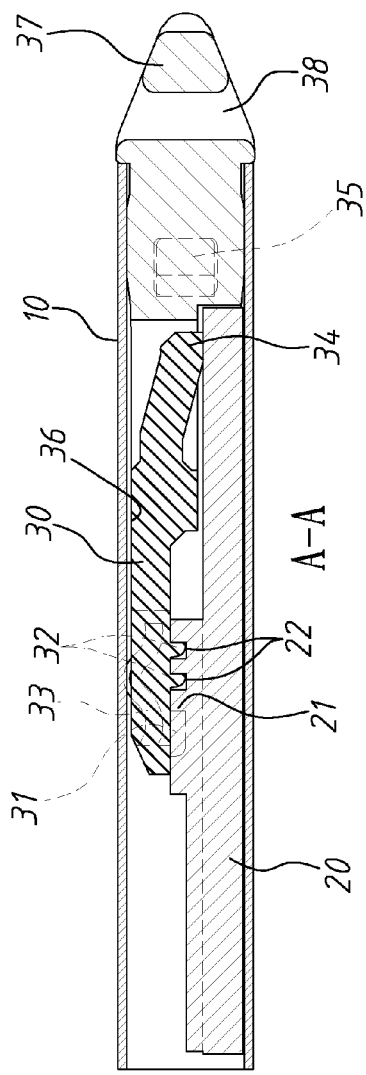
FIG. 5 is a sectional view taken along line A-A of FIG. 4.

Referring to FIG. 3 and FIG. 3A, the memory 30 comprises at least one fastening means for fastening to the tray 20. In this embodiment, longitudinal locating grooves 21 and transverse locating grooves 22 are located on a top surface 201 of the tray 20 and respectively surrounded by raised ribs 202; longitudinal locating blocks 31 and transverse locating blocks 32 are protruded from the memory 30 and respectively engaged into the longitudinal locating grooves 21 and transverse locating grooves 22 of the tray 20. In order to facilitate quick installation and to enhance structural stability, the longitudinal locating grooves 21 (or transverse locating grooves 22) can be made in an open-end design, and the transverse locating grooves 22 (or longitudinal locating grooves 21) can be made in an enclosed design. In this embodiment, the longitudinal locating grooves 21 are open-ended grooves, and the transverse locating grooves 22 are close-ended grooves. Thus, the tray 20 and the memory 30 can be quickly assembled together, ensuring a high level of structural stability. As illustrated, the memory 30 has a stepped bottom wall formed of a first step 301, a second step 302 and a third step 30 that rise one behind another. The memory 30 further comprises at least one vertical clearance compensation spring means. In this embodiment, the memory 30 comprises a first vertical clearance compensation spring leaf 33, a second vertical clearance compensation spring leaf 34 and a third vertical clearance compensation spring leaf 35. The first vertical clearance compensation spring leaf 33 and the second vertical clearance compensation spring leaf 34 are respectively positioned in a respective hole in the first step 301 and the second step 302 during formation of the memory 30, and respectively protruding over the opposing top and bottom surfaces of the memory 30. In this embodiment, the first vertical clearance compensation spring leaf 33 protrudes over the top surface 36 at the first step 301 of the memory 30; the second vertical clearance compensation spring leaf protrudes over the bottom surface of the memory 30 corresponding to the second step 302; the third vertical clearance compensation spring leaf 35 protrudes over the top surface 36 of the memory 30 and the bottom surface of the memory 30 corresponding to the third step 303 at a relatively smaller height than the elevational protrusion of the first vertical clearance compensation spring leaf 33 and the second vertical clearance compensation spring leaf 34.

In this embodiment, the memory 30 further comprises an end portion 37, and a hanging hole 38 located at the end portion 37 to facilitate hanging and carrying.

Referring to FIGS. 2-6, the memory 30 is attached to the tray 20 to engage the longitudinal protruding blocks 31 and transverse protruding blocks 32 at the bottom surface of the first step 301 of the memory 30 into the respective longitudinal grooves 21 and transverse grooves 22 at the top surface 201 of the tray 20, and then the assembled memory 30 and tray 20 are inserted into the inside of the housing 10. During insertion of the assembled memory 30 and tray 20 into the inside of the housing 10, the first vertical clearance compensation spring leaf 33, the second vertical clearance compensation spring leaf 34 and the third vertical clearance compensation spring leaf 35 are compressed. When the assembled memory 30 and tray 20 are set in the housing 10, the first vertical clearance compensation spring leaf 33, the second vertical clearance compensation spring leaf 34 and the third vertical clearance compensation spring leaf 35 are immediately forced by the stored elastic potential energy thereof to return to their former shape, causing the first vertical clearance compensation spring leaf 33 to stop against the upper surface of the inner perimeter of the housing 10, the second vertical clearance compensation spring leaf 34 to be stopped between the memory 30 and the tray 20, and the third vertical clearance compensation spring leaf 35 to stop against the opposing upper and bottom surfaces of the inner perimeter of the housing 10, and thus the USB memory stick is assembled. Further, in this embodiment, the housing 10 provides a frame hole 11; the memory 30 provides a locating block 39 for positioning in the frame hole 11 of the housing 10 to enhance connection stability between the housing 10 and the assembled memory 30 and tray 20.

Figures 7, 7A:
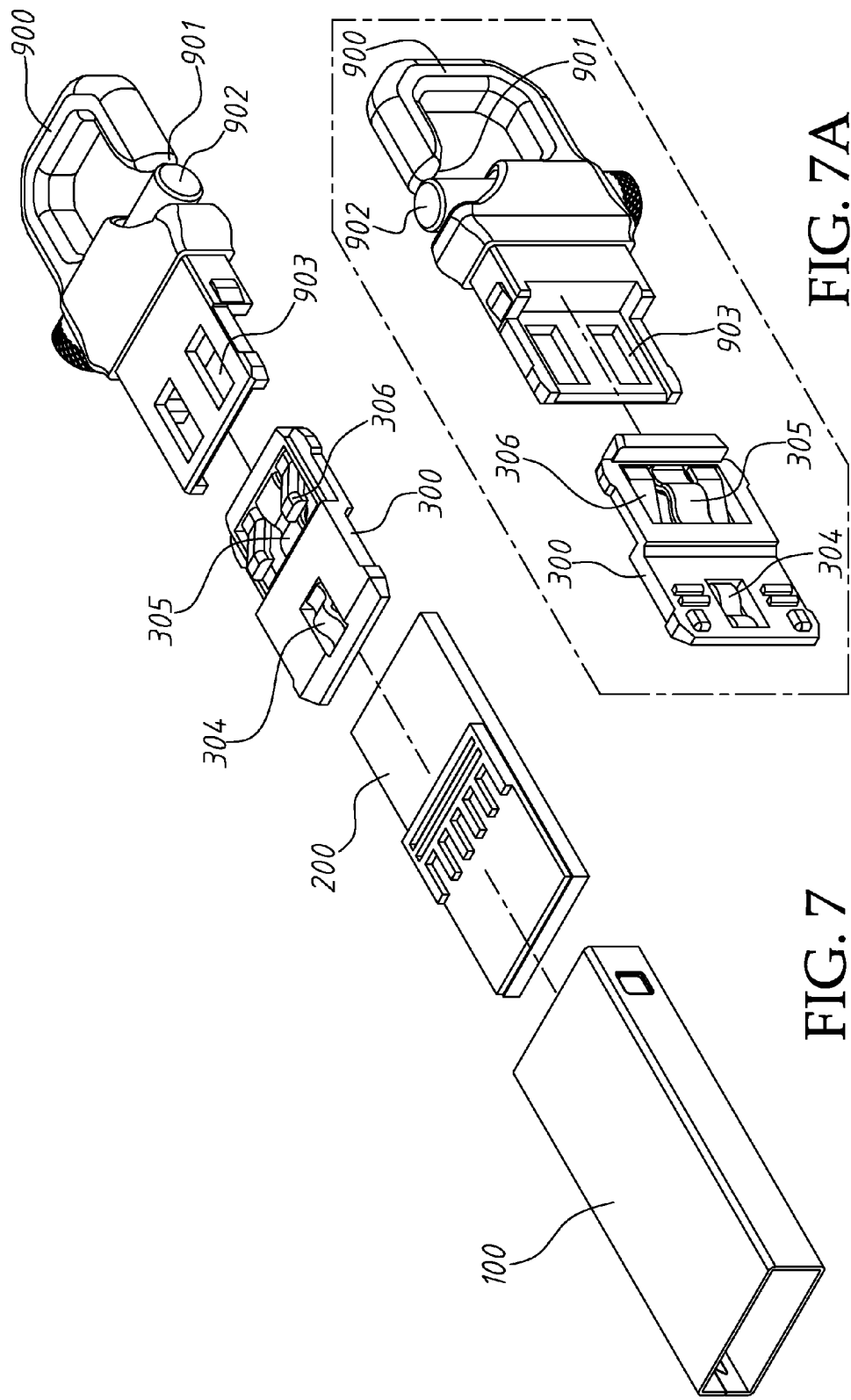
FIG. 7 is an exploded view of a USB memory stick in accordance with a second embodiment of the present invention.
FIG. 7A is a bottom view of the memory and the end piece shown in FIG. 7.
Figure 8:
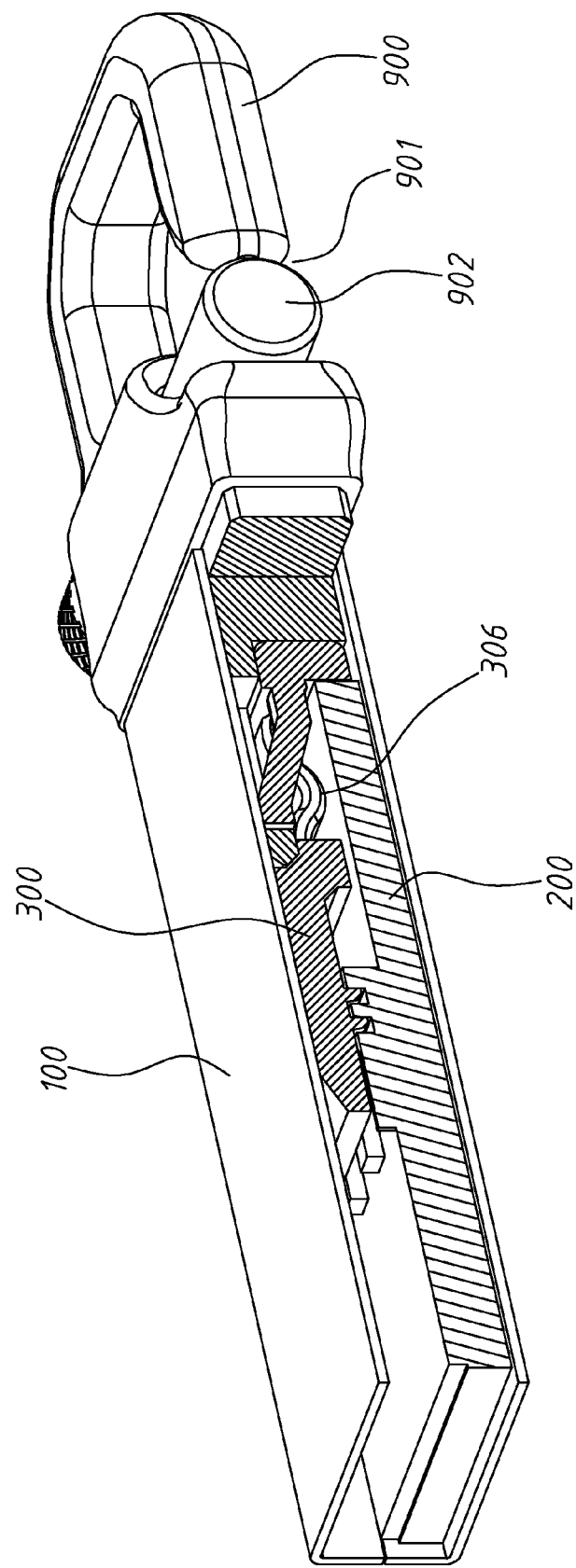
FIG. 8 is a sectional elevational assembly view, in an enlarged scale, of the USB memory stick shown in FIG. 7.

Referring to FIGS. 7, 7A and 8, a USB memory stick in accordance with a second embodiment of the present invention is shown. The USB memory stick of this second embodiment comprises a housing 100, a tray 200, a memory 300, and an end piece 900. The end piece 900 is made in the form of a safety hook, comprising a throat 901, a spring-loaded latch 902 that normally closes the throat 901, and at least one, for example, two hook holes 903. The design of the end piece 900 enables the USB memory stick to be used as a key ring. The memory 300 is fastened to the tray 200 in the same manner as the aforesaid first embodiment. In this embodiment, the memory 300 comprises a plurality of vertical clearance compensation spring leaves 34; 35, and at least one, for example, two springy hook blocks 306 respectively hooked in the hook holes 903 of the end piece 900.

In conclusion, the invention provides a USB memory stick that facilitates quick assembly, carrying, hanging and storage, involves an inventive step in spatial configuration arrangement, and has an industrial value.

Although particular embodiments of the invention have been described in detail for purposes of illustration, various modifications and enhancements may be made without departing from the spirit and scope of the invention. Accordingly, the invention is not to be limited except as by the appended claims.

What the invention claimed is:

1. A USB memory stick, comprising:
a housing being a hollow frame shell having a predetermined height and width, said housing comprising mounting positioning means;
a tray comprising fastening means; and
a memory attachable to said tray and mountable with said tray in said housing, said memory comprising mating fastening means fastenable to said fastening means of said tray, a stepped bottom wall formed of a plurality of steps rising one behind another, vertical clearance compensation spring means disposed corresponding to said steps, and mating mounting positioning means for engagement with said mounting positioning means of said housing.

2. USB memory stick as claimed in claim 1, wherein said fastening means of said tray comprises a plurality of locating grooves located one of opposing top and bottom surfaces of said tray; said mating fastening means of said memory comprises a plurality of locating blocks located on one of opposing top and bottom surfaces of said memory and respectively engageable into said locating grooves.

3. USB memory stick as claimed in claim 2, wherein said locating grooves are located on the top surface of said tray and respectively extending in longitudinal and transverse directions; said tray further comprises a plurality of raised ribs located on the top surface thereof and respectively surrounding said locating grooves; said locating blocks are located on the bottom surface of said memory and respectively extending in longitudinal and transverse directions and respectively engaged into said locating grooves of said tray.

4. The USB memory stick as claimed in claim 3, wherein the locating grooves of said tray that extend in one of the longitudinal and transverse directions are open-ended grooves, and the other locating grooves that extend in the other of the longitudinal and transverse directions are close-ended grooves.

5. The USB memory stick as claimed in claim 1, wherein said stepped bottom wall of said memory is formed of a first step, a second step and a third step that rise one behind another; said vertical clearance compensation spring means of said memory comprises a first vertical clearance compensation spring leaf positioned in a hole in said first step of said memory, a second vertical clearance compensation spring leaf positioned in a hole in said second step of said memory and a third vertical clearance compensation spring leaf positioned in said third step of said memory, said first vertical clearance compensation spring leaf and said second vertical clearance compensation spring leaf respectively protruding over opposing top and bottom surfaces of said memory, said third vertical clearance compensation spring leaf protruding over the opposing top and bottom surfaces of said memory corresponding to said third step at a relatively smaller height than the elevational protrusion of said first vertical clearance compensation spring leaf and said second vertical clearance compensation spring leaf.

6. The USB memory stick as claimed in claim 5, wherein said first vertical clearance compensation spring leaf protrudes over the top surface of said memory corresponding to said first step; said second vertical clearance compensation spring leaf protrudes over the bottom surface of said memory corresponding to said second step.

7. The USB memory stick as claimed in claim 1, wherein said memory further comprises an end portion located at one end thereof, and a hanging hole formed in said end portion.

8. The USB memory stick as claimed in claim 1, further comprising an end piece made in the form of a safety hook and fastened to said memory, said end piece comprising a throat and a spring-loaded latch adapted to normally close said throat.

9. The USB memory stick as claimed in claim 8, wherein said memory comprises at least one springy hook block; said end piece comprises at least one hook hole respectively engaged with said at least one spring hook block of said memory.

10. The USB memory stick as claimed in claim 8, wherein said fastening means of tray comprises a plurality of locating grooves located one of opposing top and bottom surfaces of said tray; said mating fastening means of said memory comprises a plurality of locating blocks located on one of opposing top and bottom surfaces of said memory and respectively engageable into said locating grooves.

11. USB memory stick as claimed in claim 10, wherein said locating grooves are located on the top surface of said tray and respectively extending in longitudinal and transverse directions; said tray further comprises a plurality of raised ribs located on the top surface thereof and respectively surrounding said locating grooves; said locating blocks are located on the bottom surface of said memory and respectively extending in longitudinal and transverse directions and respectively engaged into said locating grooves of said tray.

12. The USB memory stick as claimed in claim 11, wherein the locating grooves of said tray that extend in one of the longitudinal and transverse directions are open-ended grooves, and the other locating grooves that extend in the other of the longitudinal and transverse directions are close-ended grooves.

\* \* \* \* \*